US006811853B1

(12) United States Patent
Sherrer et al.

(10) Patent No.: US 6,811,853 B1
(45) Date of Patent: Nov. 2, 2004

(54) SINGLE MASK LITHOGRAPHIC PROCESS FOR PATTERNING MULTIPLE TYPES OF SURFACE FEATURES

(75) Inventors: David W. Sherrer, Radford, VA (US); Gregory A. TenEyck, Blacksburg, VA (US)

(73) Assignee: Shipley Company, L.L.C., Marlborough, MA (US)

(*) Notice: Subject to any disclaimer, the term of this patent is extended or adjusted under 35 U.S.C. 154(b) by 0 days.

(21) Appl. No.: 09/519,165

(22) Filed: Mar. 6, 2000

(51) Int. Cl.[7] .............................. B32B 3/24; G02B 6/42
(52) U.S. Cl. ..................... 428/138; 428/137; 428/156; 428/167; 428/209; 428/457; 216/41; 216/47; 216/2; 216/24; 216/79; 216/99; 216/46; 385/88; 385/49; 385/14; 385/65; 385/83; 385/137; 29/464
(58) Field of Search ............................... 428/138, 137, 428/156, 457, 167, 209; 216/46, 41, 47, 2, 24, 79, 99; 385/88, 49, 14, 65, 83, 137; 29/464

(56) References Cited

U.S. PATENT DOCUMENTS

| 4,004,341 A | 1/1977 | Tung ............................ 29/571 |
| 4,013,532 A | 3/1977 | Cormia et al. |

(List continued on next page.)

FOREIGN PATENT DOCUMENTS

| GB | 221587 A | 9/1989 |
| GB | 2215987 A | 9/1989 |

*Primary Examiner*—William P. Watkins, III
(74) *Attorney, Agent, or Firm*—Jonathan D. Baskin

(57) ABSTRACT

A method for patterning different types of surface features on a semiconductor substrate (e.g. metal pads, etched pits and grooves) where the features are accurately located by a single mask. First, a dielectric layer is formed on the substrate. Next, an etch-resistant metal layer is formed on the dielectric and patterned according to a mask. Then, a patterned resist mask (e.g. PMMA) is formed on the patterned metal so that areas of the dielectric are exposed. The resist mask has edges that lie on top of the patterned metal layer. Therefore, the exposed dielectric areas are bounded by patterned metal. Then, the dielectric layer is etched using a directional dry etch to expose the underlying semiconductor substrate. Then, the semiconductor substrate is etched. The dielectric layer functions as a mask in the substrate etching step. Since the metal pattern determines the areas of the substrate that are etched, all the features are located according to the original mask that defined the metal pattern. Subsequent masking steps can expose other areas of the substrate to different etching or deposition processes.

31 Claims, 8 Drawing Sheets

U.S. PATENT DOCUMENTS

| | | |
|---|---|---|
| 4,079,404 A | 3/1978 | Comerford et al. |
| 4,212,719 A | 7/1980 | Osada et al. |
| 4,326,330 A | 4/1982 | LePage et al. |
| 4,453,305 A | 6/1984 | Janes et al. |
| 4,692,998 A | 9/1987 | Armstrong .................. 437/225 |
| 4,730,198 A | 3/1988 | Brown et al. |
| 4,779,946 A | 10/1988 | Pimpinella et al. |
| 4,810,557 A | 3/1989 | Blonder ...................... 428/156 |
| 4,863,560 A | 9/1989 | Hawkins ..................... 156/644 |
| 4,927,784 A | 5/1990 | Kazior et al. |
| 4,945,400 A | 7/1990 | Blonder et al. |
| 4,957,592 A | 9/1990 | O'Neill |
| 5,042,709 A | 8/1991 | Cina et al. |
| 5,163,108 A | 11/1992 | Armiento et al. |
| 5,179,609 A | 1/1993 | Blonder et al. |
| 5,185,293 A | 2/1993 | Franke et al. |
| 5,259,054 A | 11/1993 | Benzoni et al. |
| 5,268,066 A | 12/1993 | Tabasky et al. |
| 5,337,398 A | 8/1994 | Benzoni et al. |
| 5,355,386 A | 10/1994 | Rothman et al. |
| 5,436,996 A | 7/1995 | Tabasky et al. |
| 5,499,732 A | 3/1996 | Nishimoto |
| 5,522,000 A | 5/1996 | Ayliffe et al. |
| 5,550,088 A | 8/1996 | Dautartas et al. |
| 5,632,908 A | 5/1997 | Shahid |
| 5,719,073 A | 2/1998 | Shaw et al. |
| 5,738,757 A | 4/1998 | Burns et al. ............. 156/644.1 |
| 5,815,616 A | 9/1998 | Bishop et al. |
| 5,862,283 A | 1/1999 | Trott et al. |
| 5,896,481 A | 4/1999 | Beranek et al. |
| 5,961,849 A | 10/1999 | Bostock et al. |
| 5,964,397 A | 10/1999 | Dautartas |
| 5,966,486 A | 10/1999 | Boudreau et al. |
| 6,023,339 A | 2/2000 | Haugsjaa et al. |
| 2001/0050266 A1 * | 12/2001 | Sherrer et al. ................ 216/24 |
| 2002/0012885 A1 | 1/2002 | Steinberg et al. |
| 2002/0031711 A1 | 3/2002 | Steinberg et al. |
| 2003/0003382 A1 | 1/2003 | Sherrer et al. |
| 2003/0067049 A1 | 4/2003 | Steinberg et al. |
| 2003/0081914 A1 | 5/2003 | Steinberg et al. |
| 2003/0123816 A1 | 7/2003 | Steinberg et al. |

* cited by examiner

SINGLE MASK LITHOGRAPHIC PROCESS FOR PATTERNING MULTIPLE TYPES OF SURFACE FEATURES

RELATED APPLICATIONS

The present invention was previously described in abandoned provisional patent application 60/118,011 filed Feb. 1, 1999, which is hereby incorporated by reference.

FIELD OF THE INVENTION

The present invention relates generally to methods for making optical, mechanical and electrical micromachined devices. More particularly, the present invention relates to making devices having different feature types (e.g. etched pits, grooves, metal pads) that are accurately located using a single masking step.

BACKGROUND OF THE INVENTION

Micromachined silicon chips are often used for aligning and packaging microoptical components. The silicon chip may have grooves, pits and other etched features that hold fibers, ball lenses, filters or active electrooptical devices. Also, the silicon chip may have metal pads for locating electrooptic devices. For proper operation, microoptical components must be located with high accuracy. Typically, such components must be located with a tolerance more accurate than 1 micron. In order for microoptical components to be located with such high accuracy on a silicon chip, the silicon chip must have features (e.g. grooves, pits, bumps, metal pads, edges) that are located with equal or higher accuracy.

Different features on a silicon chip are typically made using different etching and deposition techniques. For example, V-grooves are made using anisotropic chemical etches and high-aspect ratio trenches with vertical sidewalls are made using directional dry etching techniques such as reactive ion etching. The same single mask cannot be used for both processes because chemical etching will occur in areas to be dry-etched, and dry etching will occur in areas to be chemically etched. A different mask must be applied for each etching technique. This presents a problem in manufacturing certain microoptical devices because aligning a new mask to a feature present on a wafer is time-consuming and relatively inaccurate. If a new mask is applied for every kind of feature to be rendered in the wafer, the features will not be accurately located with respect to one another. This ultimately produces poor alignment tolerance between microoptical components in a microoptical device.

What is needed is a method for manufacturing many different kinds of mechanical features on a wafer using a single masking step so that the features are accurately located.

U.S. Pat. No. 4,863,560 to Hawkins discloses a method for forming different anisotropically etched features in a silicon substrate using several different masks. Alignment and masking steps are not required between etching steps. However, the method of Hawkins does require that successive masks are aligned to one another, and this is a source of misalignment. Masks cannot be aligned accurately to one another to meet the alignment tolerances required of microoptical devices.

U.S. Pat. No. 5,738,757 to Burns et al. discloses a method for multi-depth silicon etching where the mask has many layers of different materials such as silicon dioxide and silicon nitride. The masking layers are removed one at a time, and the different regions of the wafer are exposed to etch at different steps in the manufacturing process. Areas of the wafer exposed at the beginning of the process are etched deeply; areas exposed late in the process are etched only slightly. A disadvantage of the method of Burns et al. is that different etching techniques cannot be totally isolated to different etched regions on the wafer. According to the method of Burns et al., once a region is exposed, there is no way to re-mask it so that it is not affected by subsequent etching steps.

U.S. Pat. No. 4,692,998 to Armstrong et al. discloses a single mask technique for making PIN diodes and similar semiconductor devices.

U.S. Pat. No. 4,004,341 to Tung discloses a method for making high-speed field effect transistors where a trench structure is defined by chromium band that acts as a mask. The method of Tung cannot be used to make a wide variety of micromechanical structures using different etch techniques.

U.S. Pat. No. 4,810,557 to Blonder discloses a method for making a groove in <100> silicon that has a wide portion and a narrow portion. Blonder uses two masking layers to selectively expose the wide portion before exposing the narrow portion, which requires less etching time. In a final step, both wide and narrow portions are exposed and the entire groove is completed in the same etching step. The method of Blonder cannot be used with dissimilar etching techniques and cannot be used to accurately locate a V-groove with respect to features etched by other techniques, or to metallization patterns.

There is a need in the art of micromachining and microoptical device manufacturing for a method of making a variety of mechanical and electrical features on a substrate using a single masking step. This will assure that features are accurately aligned to one another.

OBJECTS AND ADVANTAGES OF THE INVENTION

Accordingly, it is a primary object of the present invention to provide a method for making micromachined devices that:
1) uses a single masking step to locate different mechanical and electrical features and fiducial features;
2) is compatible with silicon micromachining;
3) can be used to make a variety of micromachined optical, electrical, and mechanical devices.

These and other objects and advantages will be apparent upon reading the following description and accompanying drawings.

SUMMARY OF THE INVENTION

These objects and advantages are attained by the present method for fabricating accurately located etched features on a semiconductor substrate. In a first step, a semiconductor substrate with a dielectric layer on a top surface is provided. Then, a patterned metal layer is formed on the dielectric layer. The patterned metal layer can be made using conventional lift-off techniques or masking and etching. Then, a patterned resist layer is formed on the dielectric layer and patterned metal layer. The resist layer is patterned so that edges of the resist are located on top of the metal patterns. This assures that of the dielectric are exposed and areas of the patterned metal layer are exposed. Next, areas of the dielectric not covered by the resist or metal are etched away (e.g. by a dry etch process). Then, exposed areas of the semiconductor substrate are etched. The etched areas of the semiconductor substrate are accurately aligned with respect to the original metal pattern.

Preferably, the semiconductor substrate is made of silicon, but it can also be made of GaAs, germanium or other etchable semiconductors. Anisotropically etchable semiconductors are preferred. Preferably, the dielectric layer is silicon dioxide, but other dielectric layers such as silicon nitride and silicon carbide can also be used.

The patterned metal layer can be made of chromium, gold, titanium, platinum, aluminum, silver, nickel, tungsten, copper or tantalum. Chromium is particularly preferred. Also, the patterned metal layer can comprise several layered metals. Examples include an adhesion layer (titanium or tungsten), a diffusion barrier (nickel or platinum) and a contact layer (gold).

The dielectric layer is preferably etched using dry directional etching such as reactive ion etching. Other suitable directional dry etching techniques are known. Also, the dielectric layer can be etched using wet etches such as fluoride-based wet etches.

The semiconductor substrate can be etched using anisotropic wet etching techniques or dry etching techniques.

In a preferred embodiment, the patterned metal layer comprises a ring shape that encloses the area to be etched. The patterned resist layer does not cover the interior of the ring in this embodiment.

The present invention also includes embodiments where the process is repeated for different regions on the semiconductor substrate. Each region etched is defined by the metal pattern. Between process steps, the resist layer should be removed and reapplied. Alternatively, resist is removed from selected areas and not reapplied.

Also, the patterned metal layer can comprise a U-shape pattern or any other pattern that can serve to provide a edge that defines an etch sidewall. The metal pattern does not need to be in the shape of a ring.

Also, the present invention includes an apparatus made according to the method of the present invention. The apparatus of the present invention includes a semiconductor substrate with an etched pit. The etched pit has sidewalls. A dielectric layer is disposed on the semiconductor substrate. The dielectric layer has a hole with sidewalls and the hole is aligned with the etched pit. The sidewalls of the dielectric layer are aligned with the sidewalls of the etched pit. The apparatus also has a patterned metal layer disposed on the dielectric layer adjacent to the hole in the dielectric. The metal layer has edges and the metal edges are aligned with the sidewalls of the dielectric hole and the sidewalls of the semiconductor etched pit.

In one embodiment, the metal layer has damaged portions (damage resulting from exposure to etchants used to etch the semiconductor pit and/or the hole in the dielectric layer)

The damaged portions are located adjacent to the dielectric sidewalls and semiconductor sidewalls. The metal layer also necessarily has undamaged portions (i.e. portions that have not been exposed to etchants used to etch the dielectric layer and semiconductor pit). The dielectric layer is unetched in areas adjacent to the undamaged portions of the patterned metal layer.

The damaged portions of the patterned metal layer can be damaged by exposure to an etching process that formed the semiconductor etched pit. Different etching processes damage metals in different ways. Some metals may not be damaged by exposure to the etching processes. Other metals may only be affected on the surface.

In preferred embodiment, the semiconductor is silicon and the etched pit is an anisotropically etched pit (e.g. made by exposure to EDP or KOH). The semiconductor etched pit can also be a directionally dry etched pit.

DETAILED DESCRIPTION

The present invention provides a single mask method for manufacturing mechanical and electrical features on a substrate. Because a single mask is used to define the locations of the features, the features are accurately located with respect to one another. This is particularly beneficial in microoptical applications. In the present method, a patterned metal layer determines the exact locations of mechanical and electrical features. The metal patterns divide the substrate into various regions to be processed in various ways (e.g. dry etched, chemically etched). Subsequent masking steps determine which regions are exposed during various processes. In this way, the metal pattern defined by the first mask determines the precise locations of etched regions, and subsequent masking steps determine which regions are etched during a given etching step.

Figure 1:
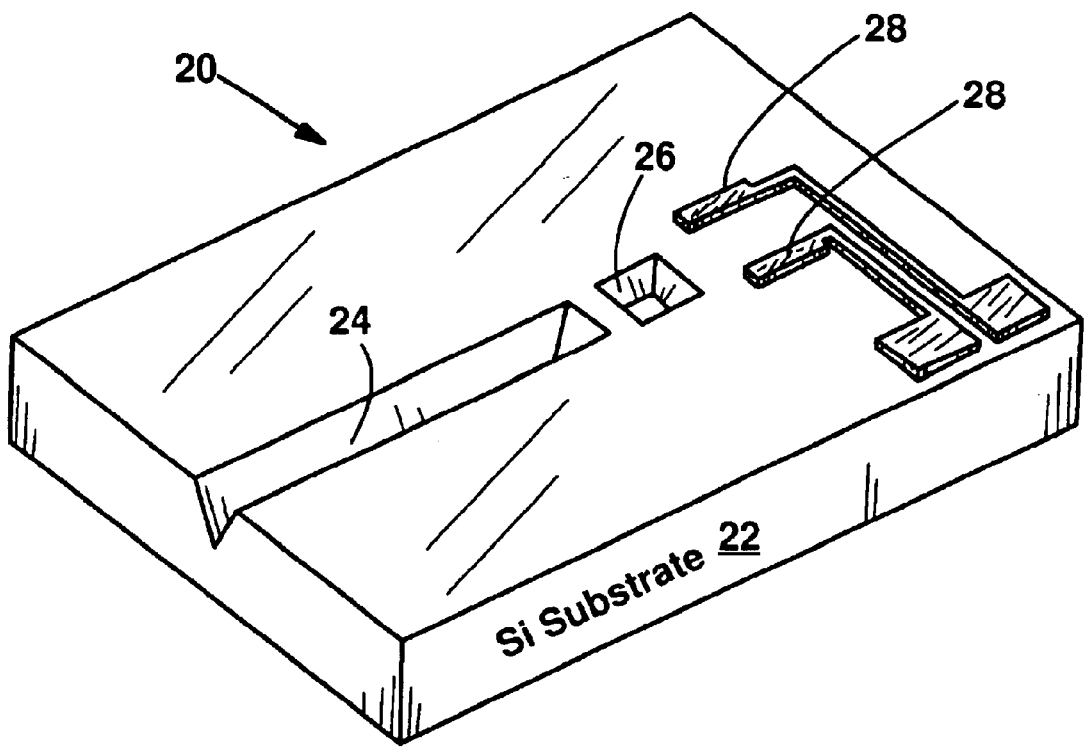
FIG. 1 shows an exemplary device can be made according to the present invention.

FIG. 1 shows a silicon microoptic submount 20 that can be made according to the method of the present invention. The submount 20 comprises a silicon substrate 22 with an anisotropically etched V-groove 24. The V-groove can hold an optical fiber (not shown) in a precise location. The substrate also has an etched pit 26 that can hold a ball lens, filter or other optical device (not shown). The pit can be etched by dry or wet anisotropic etching techniques. Also, the substrate has metal pads 28 for receiving an active optoelectronic (OE) device (not shown) and providing electrical connections for the active OE device. Reflow soldering techniques can be used to accurately locate the OE device on the metal pads 28.

In a preferred use of the submount of FIG. 1, an optical fiber, ball lens and active OE device are mounted in the V-groove, pit and metal pads, respectively. The fiber and OE device are coupled through the ball lens. Precise positioning of the V-groove 24, pit 26 and pads 28 provides precise alignment for the fiber, ball lens and OE device.

In the method of the present invention, positions of the V-groove 24, pit 26 and metal pads 28 are determine by a single mask. This assures that alignment between these features is precise.

FIGS. 2A–2H illustrate a preferred method of the present invention.

Figure 2A:
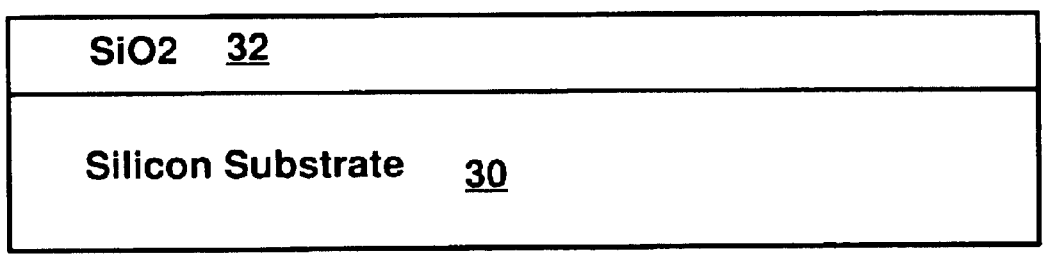
FIGS. 2A–2H illustrate a preferred method of the present invention.

FIG. 2A shows a first step of the present method where a silicon substrate 30 having a dielectric layer 32 is provided. Preferably, the dielectric layer is silicon dioxide as shown, but other materials such as silicon nitride or silicon carbide can also be used. Preferably, the dielectric layer is for example less than 5 microns, or less than 1 micron. Silicon nitride may be preferred for its high resistance to certain silicon wet anisotropic etchants such as KOH.

Figure 2B:
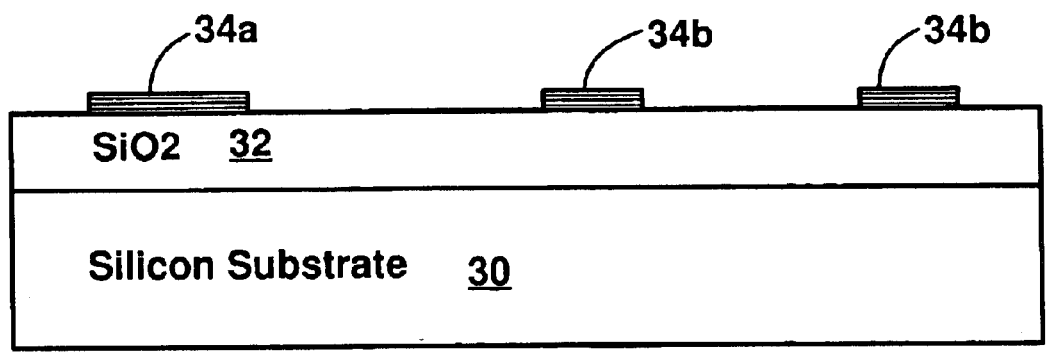

Next, In FIG. 2B, a metal layer is deposited and patterned to form metal patterns 34 comprising metal pad 34a and a metal ring 34b. The metal patterns 34 can be patterned using a lift-off technique, or deposited under a patterned resist layer and etched. Both techniques are well known in the art. In either case, the metal patterns 34 must be formed using the same single mask. The metal patterns 34 determine the precise locations of features subsequently formed into and on the substrate 30.

Figure 2C:
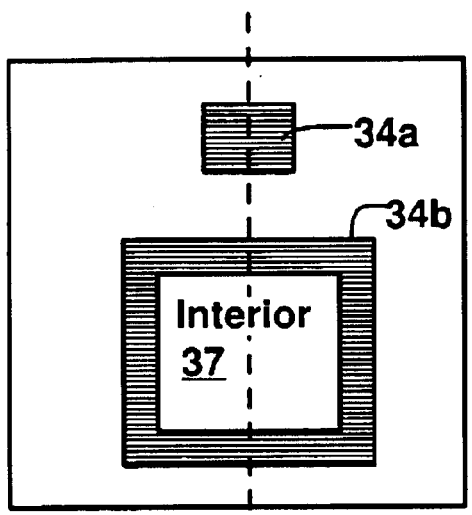

FIG. 2C shows a top view of the metal patterns 34 after patterning. FIG. 2B is a cross sectional view along line 38. Metal ring 34b encloses an area of the substrate, metal pad 34a does not. The metal ring 34b has an interior 37. The metal ring has a width 33.

Figure 2D:
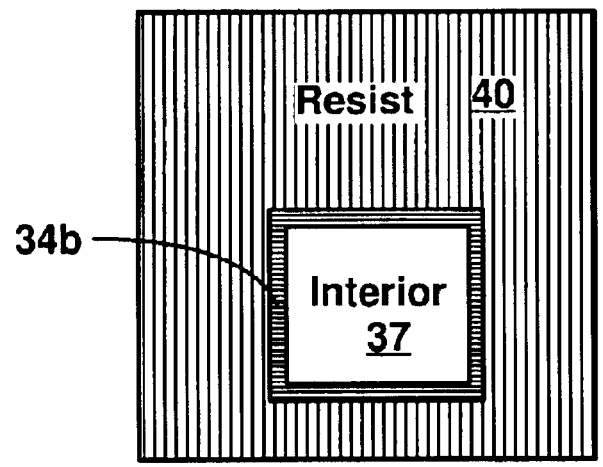
Figure 2E:
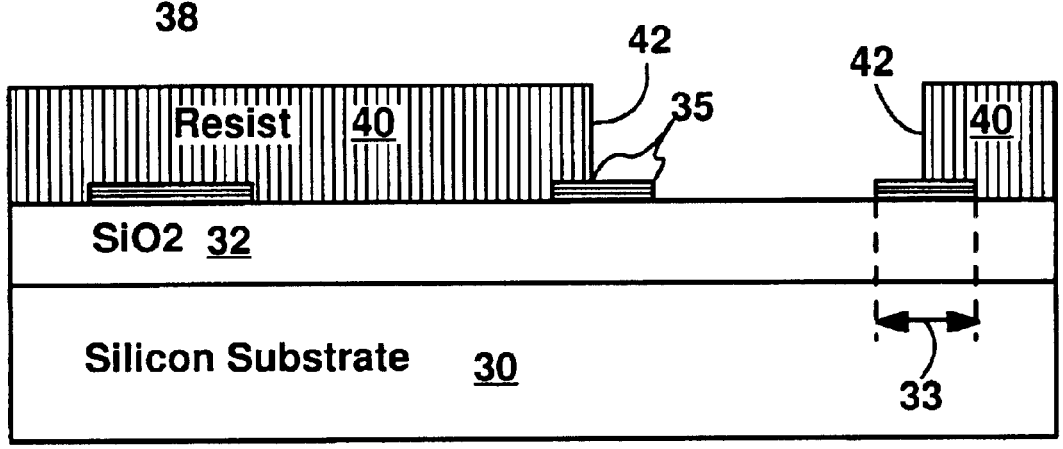

FIGS. 2D and 2E show the next step according to the present invention. Here, a resist layer 40 is pattered so that an edge 42 of the resist layer 40 is located on top of the metal ring 34b. Metal ring 34b is partially covered and has exposed portions 35. Metal pad 34a is completely covered and protected by the resist. It is important to note that the dielectric layer 32 is only exposed within the area enclosed by the metal ring 34b (i.e., interior 37). The exposed area of the dielectric layer is defined by the edge of the metal ring. The resist 40 can be one of many different known photoresist materials such as PMMA or other organic resist materials. Also, the resist material 40 can comprise a dielectric material different from the dielectric layer 32 (e.g. silicon nitride can be used for the resist if silicon dioxide is used for the dielectric layer 32).

The width 33 of the metal ring must be at least as wide as the accuracy of locating the edges 42 of the resist layer 40. Generally, the metal patterns should be at least 5 microns wide. More preferably, the metal patterns are much, much wider. Metal patterns can be 100, 500, or even 1000 microns wide so that mask alignment for subsequent resist layers is noncritical. It is noted that for some processes, it may be desirable to make the metal patterned relatively wide. Also, for some devices or processes, it may be necessary to make the metal patterns relatively narrow.

Figure 2F:
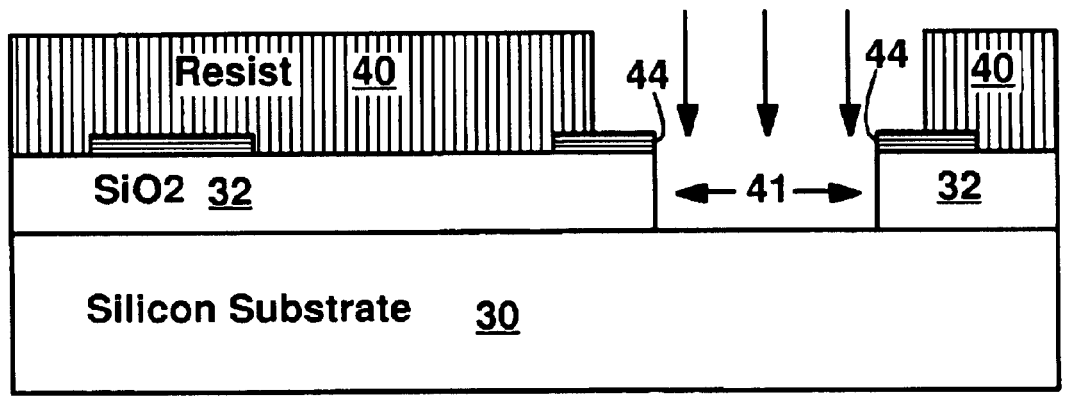

Next, in FIG. 2F, a directional etch (preferably a dry etch) is used to completely remove the dielectric layer from the exposed area within the metal ring 34b so that the dielectric layer has a hole 41. An inside metal edge 44 of the metal ring 34b accurately determines where the dielectric layer is removed. Of course, the metal and resist must be relatively resistant to the etching process, and the dielectric layer must be susceptible to the directional etching process. Preferably, the reactive ion etching is used to remove the dielectric layer.

Figure 2G:
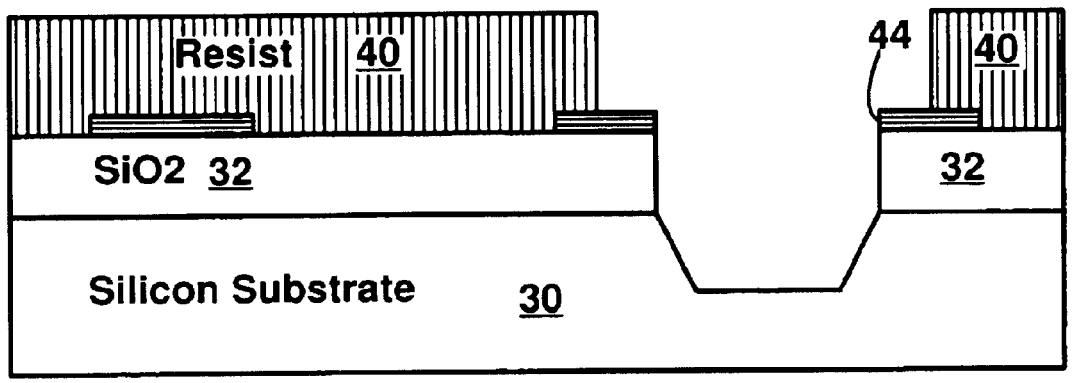

Next, in FIG. 2G, the silicon substrate 30 is etched to form a desired mechanical feature within the metal ring 34b. The dielectric layer acts as a mask during this step. In a specific embodiment, the exposed silicon is etched with an anisotropic wet etch such as EDP or KOH as is known in the art.

The silicon etching step may damage the metal ring 34b. Damage to the metal ring does not necessarily adversely affect the micromachining of the silicon. Of course, the resist should also be relatively resistant to the silicon etch if covered metal pads 34a are to be protected. Alternatively, the resist 40 is removed before the silicon substrate 30 is etched.

Figure 2H:
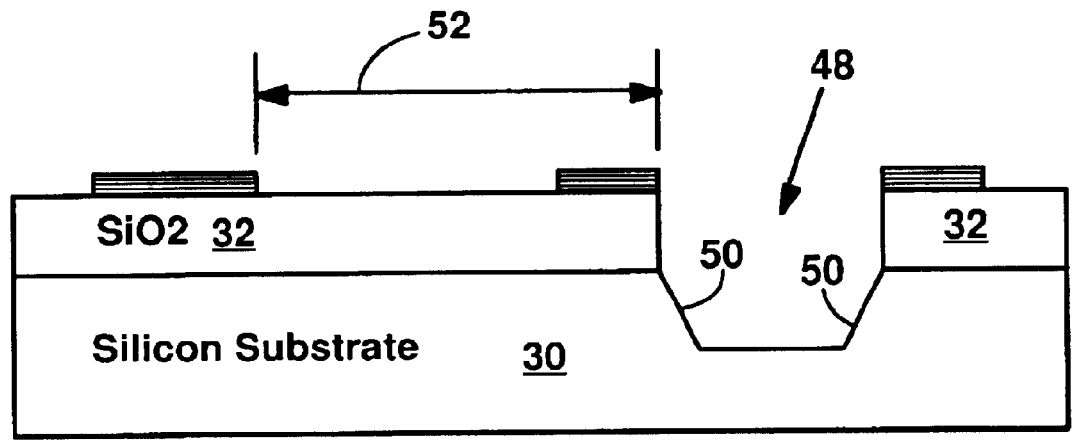

Finally, in FIG. 2H, the resist 40 is removed. The present method provides that sidewalls 50 of the etched pit 48 are extremely accurately aligned with respect to the metal pad 34a. For example, distance 52 is extremely accurate because it is defined by a single mask step. Metal pad 34a can be used as an electrical contact for an optoelectronic device. Optionally, the metal ring 34b can be removed, but this requires another masking step in order to protect the metal pad 34a.

The present invention is particularly well suited for making microoptoelectrical devices that have metal contact pads accurately positioned with respect to micromachined features. The original metal patterns 34 used to define the locations of etched pits can also be used for electrical contacts.

There are many material and etch combinations that can be used within the scope of the present invention. The substrate is preferably made of silicon, but other semiconductor materials such as gallium arsenide or germanium can also be used. Particularly preferred are semiconductors that can be anisotropically etched because anisotropic etching provides particularly useful alignment features for microoptical devices.

As noted, the dielectric layer 32 is preferably silicon dioxide, silicon nitride or silicon carbide. However, other dielectric layers can be used such as polysilicon or diamond-like carbon. Of course, polysilicon generally cannot be used in combination with silicon substrates because the dielectric layer must be resistant to etches that attack the substrate material. Many suitable material combinations for the substrate and dielectric layer are described in the literature and are known in the art.

The metal patterns must be resistant to the directional etching process that attacks the dielectric layer. In a preferred embodiment, the metal patterns comprise chromium or gold because chromium and gold are often more resistant than other metals to reactive ion etching. Specifically, chromium and gold are sufficiently resistant to fluorine-based RIE to be useful in combination with a silicon dioxide dielectric layer (silicon dioxide can be readily etched using fluorine based RIE). Other metals possibly useful for the metal patterns include nickel, titanium, platinum, aluminum, silver, and tantalum. These metals are often resistant to directional etching processes. However, suitability of a metal material in a particular directional etching process may need to be determined empirically. Also, metals resistant to particular directional etching processes are known in the art.

It is noted that the metal patterns may comprise 2, 3, or more different metal layers (e.g. Ti-Pt-Au or Cr-Ni-Au). Layered metal contact pads are commonly used in the microelectronics art and are well known.

The resist layer used is preferably a conventional photoresist such as PMMA. The resist can be positive or negative resist as is known in the art. of course, the resist must be sufficiently thick and etch resistant to protect the dielectric layer and metal patterns in covered areas. In some embodiments it is preferable to use electrodeposited photoresist because it can be deposited conformally over nonplanar surfaces. Many useful resist materials are known in the art.

Figure 3:
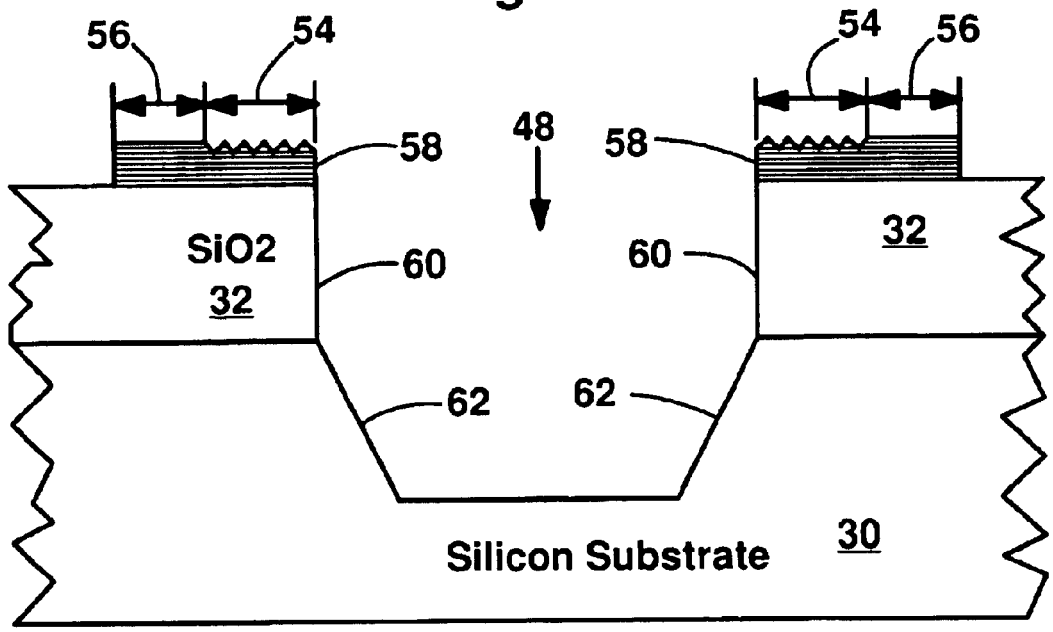
FIG. 3 shows a closeup of a pit etched according to the present invention. The pit has several unique features.

FIG. 3 shows a closeup view of the metal ring 34b and etched pit 48 of the device shown in FIG. 2H. The metal ring 34b has damaged surfaces on inner portions 54 where the metal was exposed to the dielectric layer etch (e.g. a directional dry etch) and the silicon substrate etch (e.g. a wet anisotropic etch). The damage to the metal ring can include metal removal, surface roughening, pitting, or other kinds of surface modification. The damaged inner portions 54 are generally the same as the exposed portions 35 shown in FIG. 2E. Outer portions 56 where the metal was covered by the resist are relatively undamaged. The presence of both damaged and undamaged areas on the metal ring indicates that the resist layer edge was located on top of the metal ring at the boundary of the damaged and undamaged areas. Metal pads or rings having both damaged and undamaged areas is a distinctive feature of the present invention. In preferred embodiments, the damaged areas are located on the inner portions of metal rings.

In any embodiment where micromachined features are located within the metal ring, the damage will be located on inner portions 54 of the ring. More generally, the damaged areas of the patterned metal layer are always located adjacent to etched substrate features.

Another distinguishing feature of the present invention is that metal ring sidewalls 58 are aligned essentially perfectly with dielectric layer sidewalls 60 and etched pit sidewalls 62. All these sidewalls are aligned essentially perfectly because they are all defined by the same masking step that first defined the patterned metal ring sidewalls 58.

Figure 4:
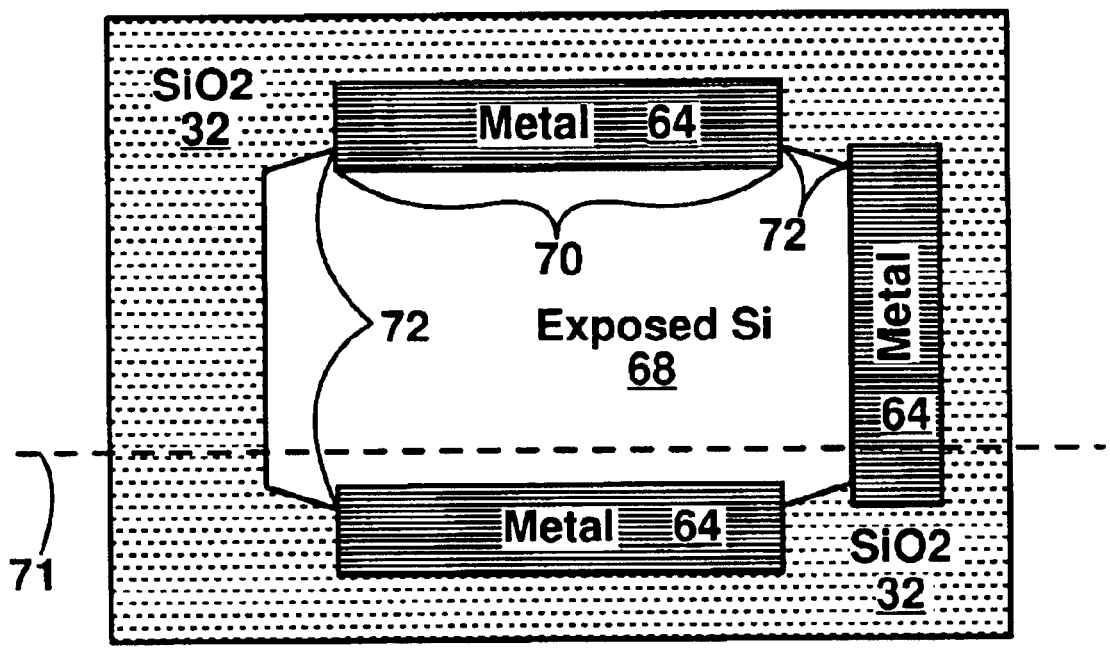
FIG. 4 shows an alternative embodiment where some sidewalls are accurately located by patterned metal, and some sidewalls are inaccurately located with the dielectric.
Figure 5:
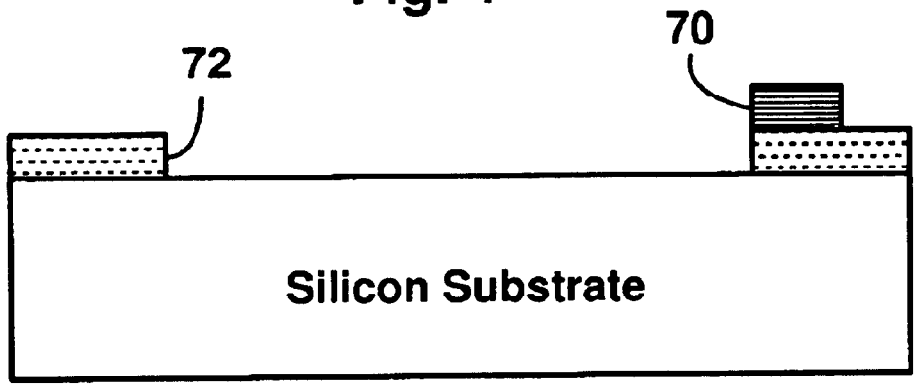
FIG. 5 shows a side view of the submount of FIG. 4.

FIGS. 4 and 5 illustrate an alternative method of the present invention. FIG. 4 shows a top view before the silicon substrate is etched, but after the dielectric layer 32 is etched. FIG. 5 shows a cross-sectional view cut along line 71. Metal rectangles 64 form an incomplete ring. The metal rectangles are disposed on top of the dielectric layer (SiO2). The dielectric layer has a hole 68 where silicon is exposed. In this embodiment, the metal rectangles 64 define edges 70 that are accurately located with respect to other metal patterns (not shown) on the submount. Edges 72 defined by only the dielectric layer are not accurately located with respect to the metal rectangles 64 because they are determined by resist. The dges 72 defined by the dielectric layer are located by the resist mask.

Figure 6:
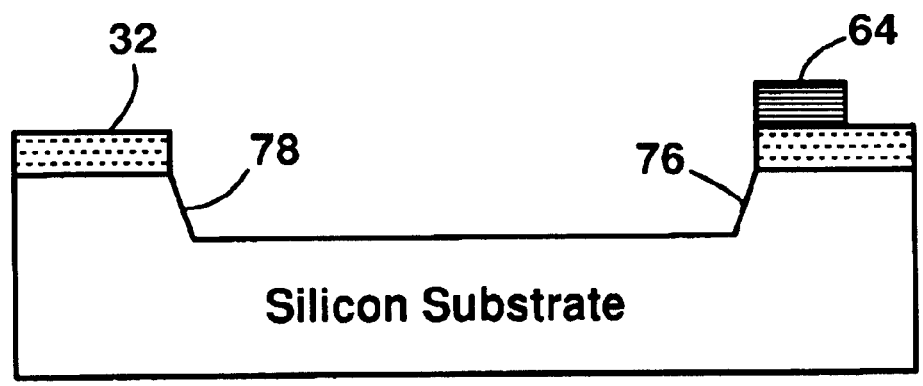
FIG. 6 shows the submount of FIG. 5 after anisotropic wet etching.

FIG. 6 shows a micromachined pit that can be made with the metal patterns and dielectric pattern shown in FIGS. 4 and 5. Sidewall 76 is accurately located because it is defined by the metal rectangle 64. Sidewall 78 is not accurately located because it is defined by the resist pattern that was used during the direction dry etch to remove the dielectric layer. Even though some sidewalls (e.g. sidewall 78) are not accurately located, using metal patterns that do not define a complete ring is quite useful. Often in microoptic applications, only one or two. accurately located sidewalls are required.

Figure 7:
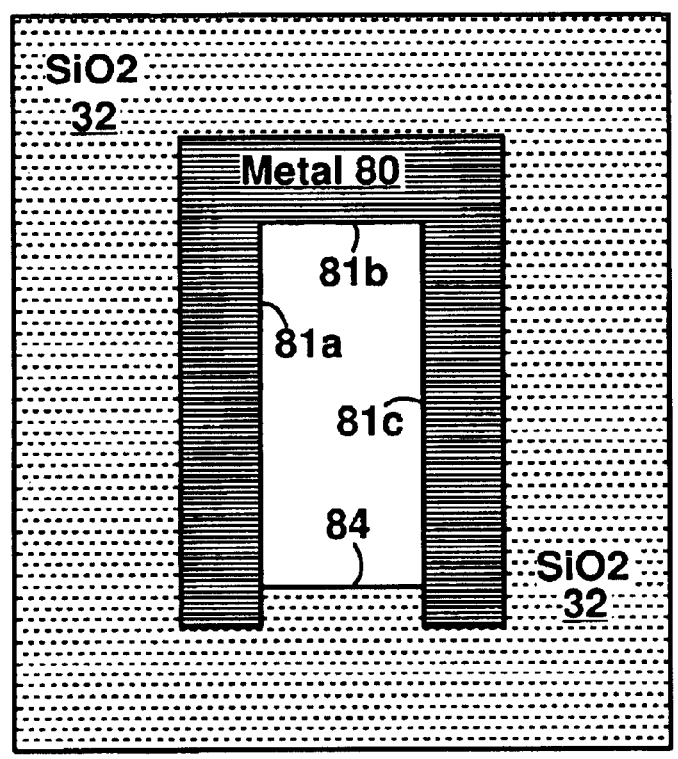
FIG. 7 shows a embodiment that uses a U-shaped patterned metal layer.

FIG. 7 shows a particularly useful embodiment of the present invention where a metal pattern 80 is U-shaped. In this embodiment, 3 edges 81a–c are accurately located by the metal pattern. Dielectric edge 84 is not accurately located.

It is noted that the semiconductor substrate can be etched using many different kinds of etching techniques including dry directional etching and wet anisotropic or isotropic etching. Generally, the semiconductor material can be etched by any technique for which the dielectric material can function as a mask.

FIGS. 8A–F illustrates a particularly useful embodiment of the invention where different areas of semiconductor substrate are etched to different depths.

Figure 8A:
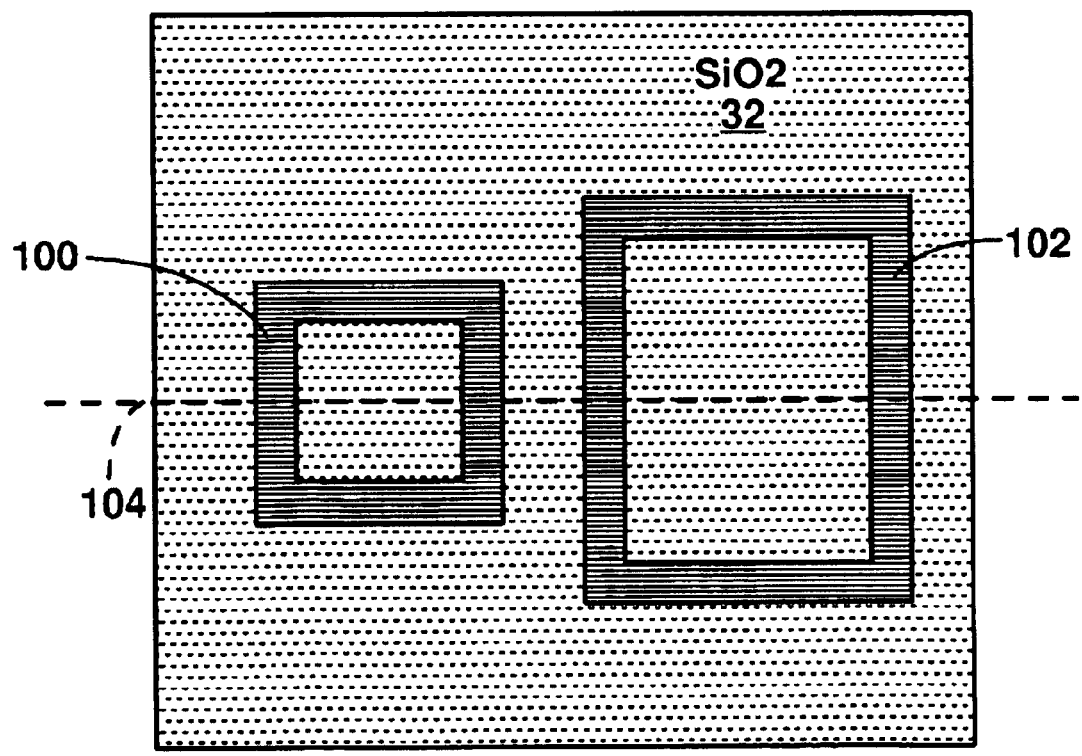
FIGS. 8A–F illustrate an embodiment of the present invention where the method is repeated to provide several accurately aligned etched features made by different etching processes.

FIG. 8A shows a top view of a metal pattern that has a small metal ring 100 and a large metal ring 102. The metal rings are disposed on a silicon dioxide layer on top of a <100> single crystal silicon substrate. The following FIGS. 8B–8G Are cross sectional views cut along line 104.

Figure 8B:
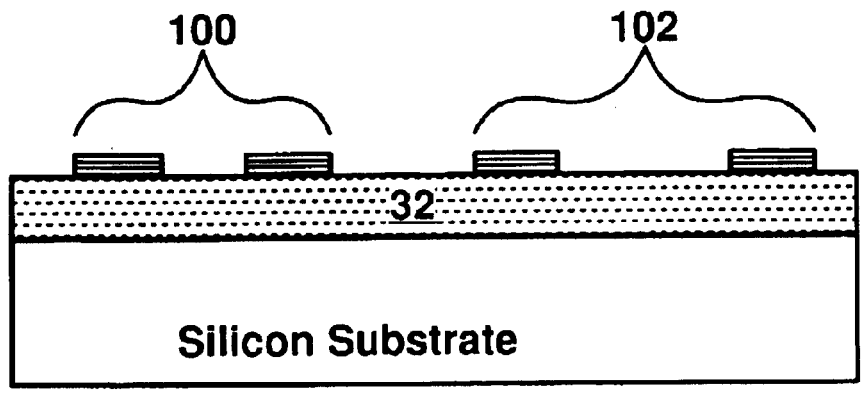

FIG. 8B shows a side view of the metal rings 100, 102.

Figure 8C:
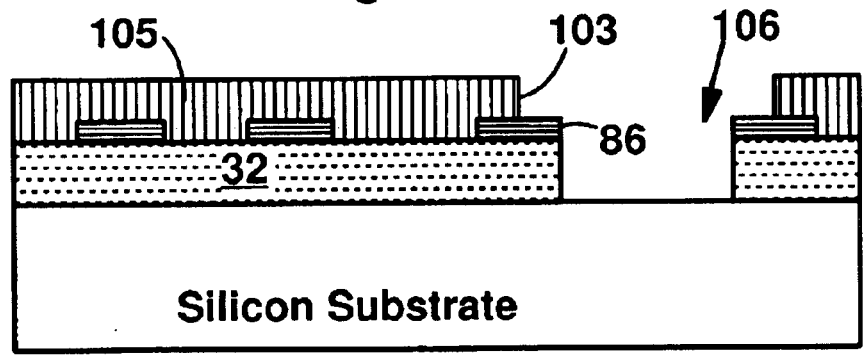

In FIG. 8C, resist 105 is applied and patterned to expose the interior of the large metal ring 102. An edge 103 of the resist is located on top of the large metal ring 102. The dielectric 32 is etched using a directional dry etch, forming a hole 106. Inner edges 86 of the large metal ring 102 define the edges of the dielectric hole 106.

Figure 8D:
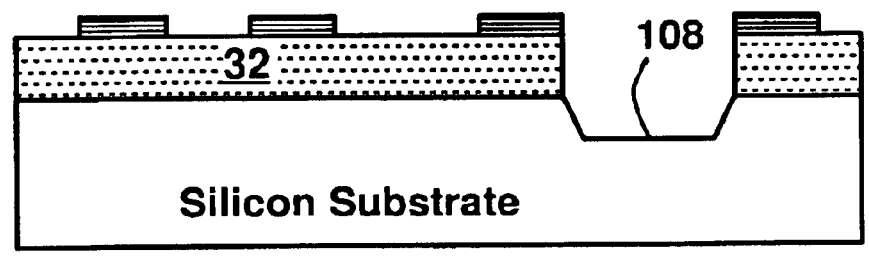

Next, in FIG. 8D, the resist is removed and the exposed substrate is etched with KOH, EDP or a similar anisotropic wet etch for silicon. In the particular embodiment shown, the silicon is not etched completely to form a V-groove. The etched pit has a flat bottom 108. The dielectric 32 acts as a mask for the wet etching.

Figure 8E:
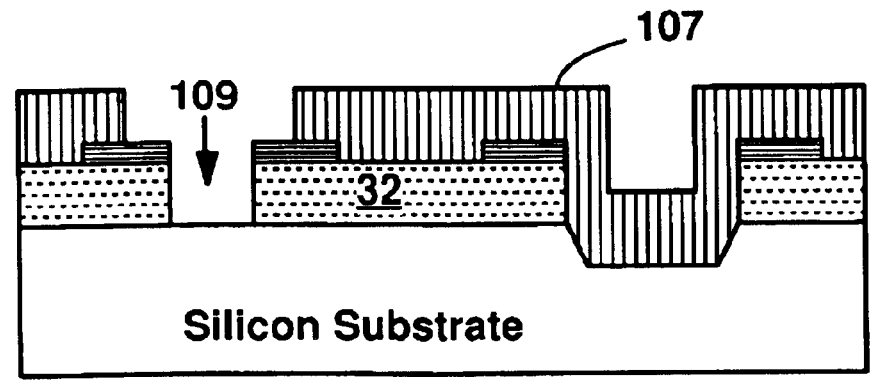

Next, in FIG. 8E, new resist 107 is reapplied and a hole is opened in the new resist to expose the dielectric surface within the small metal ring. It may be preferable to use electrodeposited resist in this step because it can be deposited conformally. Directional dry etching is then used to form a hole 109 in the dielectric 32 and expose the silicon substrate.

Figure 8F:
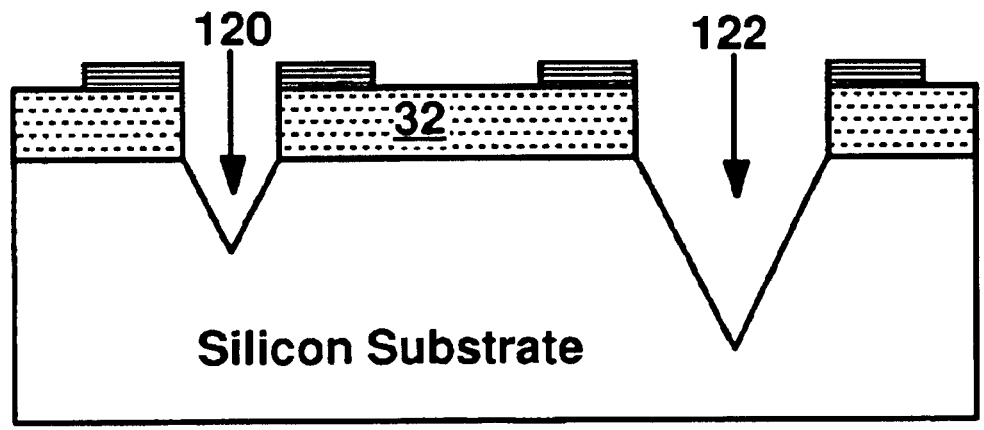

Finally, in FIG. 8F, the new resist 107 is removed, and the silicon substrate is anisotropically wet etched within both the small and large metal rings to form a small V-groove 120 and a large V-groove 122. Both the large V-groove and small V-groove are accurately located and have an accuratly determined depth.

FIGS. 9A–9E illustrates an alternative method. Here, the silicon dioxide and silicon within the small metal ring 100 is etched using a directional dry etch to form a vertical pit 110. The vertical pit has sidewalls 112.

Figure 9A:
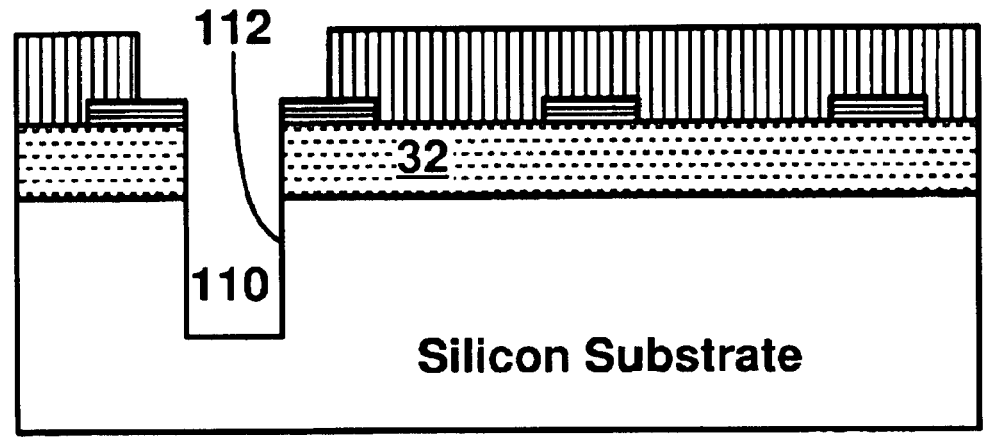
FIGS. 9A–E illustrates an embodiment of the present invention where dry-etched and wet-etched features are located using the same single mask.
Figure 9B:
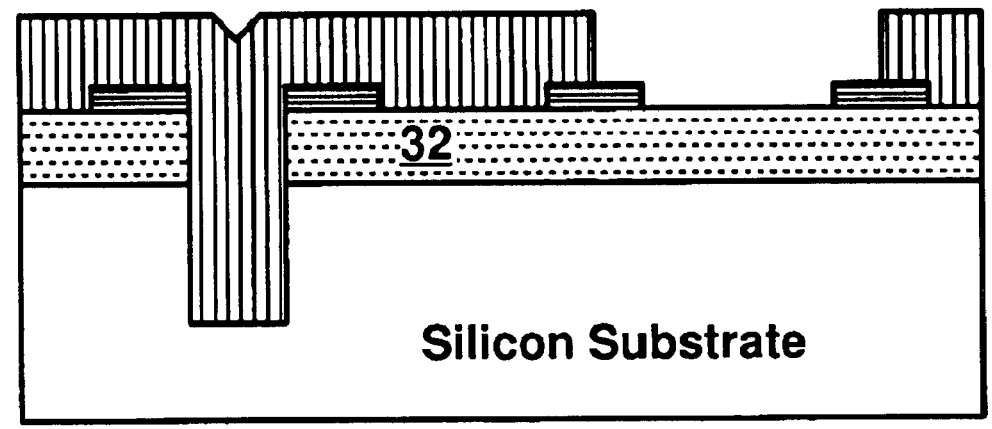

FIG. 9B shows the next step where resist is applied and removed from an area defined by the large metal ring 102.

Figure 9C:
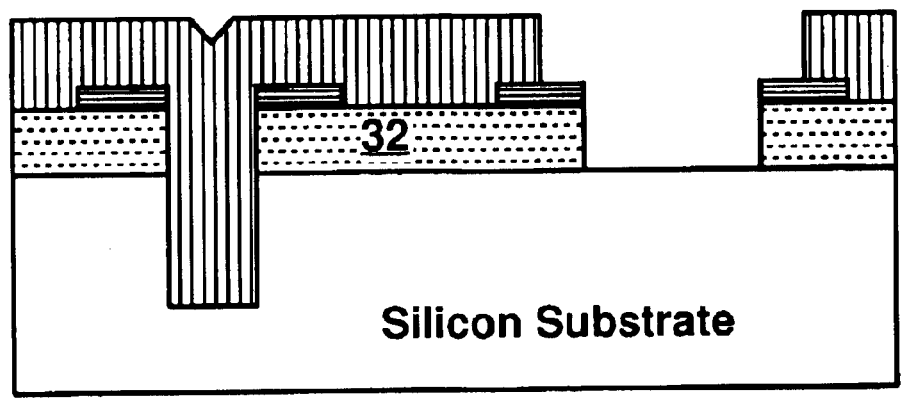
Figure 9D:
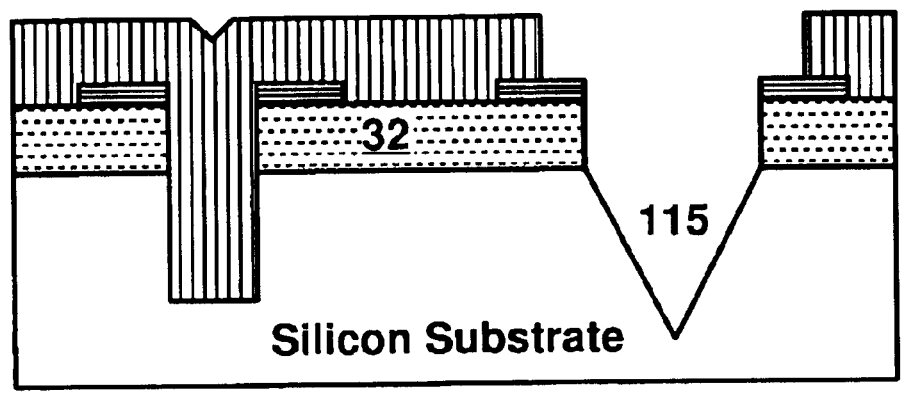
Figure 9E:
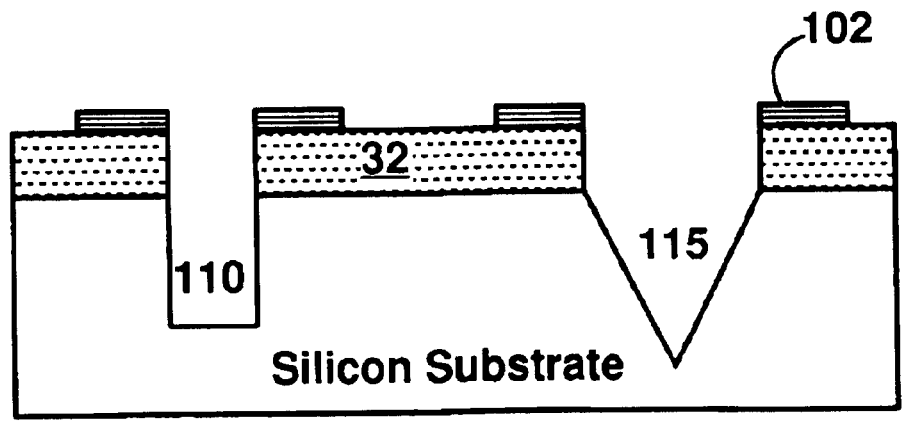

In FIG. 9C, the dielectric layer 32 is removed from within the large metal ring using a directional dry etch. In FIG. 9D, the silicon is etched using a wet anisotropic etch to form a large V-groove 115. FIG. 9E shows the final result. Since the vertical pit 110 and the large V-groove 115 are both located using the same single mask, they are accurately aligned to one another. The dry etched hole 110 is accurately aligned with the large V-groove 115.

The present invention provides a powerful method for manufacturing a variety of mechanical features in a silicon substrate that are accurately aligned. The features can be made by very dissimilar etching techniques, but are accurately located because they are defined by the same mask that patterns the metal layer. For each feature type (e.g. wet-etched, dry etched), a relatively inaccurate patterned resist layer is applied on the metal layer and dielectric layer. The edges of the resist layer are located on top of the patterned metal layer.

The present invention is particularly well suited for making submounts for optoelectronic devices that must be aligned with microoptical components. This is because the metal patterns are accurately aligned and can be used for both electrical connections to the OE device and to define areas that are to be etched. The submount shown in FIG. 1 is a good example of a submount for OE devices that can be made according to the present method.

It will be clear to one skilled in the art that the above embodiment may be altered in many ways without departing from the scope of the invention. Accordingly, the scope of the invention should be determined by the following claims and their legal equivalents.

What is claimed is:

1. An etched optoelectronic apparatus comprising:
   a) a semiconductor substrate having an etched pit with semiconductor sidewalls;
   b) a dielectric layer disposed on the semiconductor substrate, wherein the dielectric layer is planar with a uniform thickness and has a hole with dielectric sidewalls, wherein the dielectric sidewalls are aligned with the semiconductor sidewalls;
   c) a patterned metal layer disposed directly on the dielectric layer, wherein the patterned metal layer has sidewalls aligned with the dielectric sidewalls and the semiconductor sidewalls; and
   d) an optical component in the etched pit.

2. The apparatus of claim 1 wherein the patterned metal layer has damaged portions and undamaged portions, and wherein the damaged portions are adjacent to the dielectric sidewalls and semiconductor sidewalls.

3. The apparatus of claim 2 wherein the dielectric layer is unetched in areas adjacent to the undamaged portions of the patterned metal layer.

4. The apparatus of claim 2 wherein the damaged portions of the patterned metal layer are damaged by exposure to an etching process that formed the semiconductor etched pit.

5. The apparatus of claim 1 wherein the semiconductor substrate comprises single crystal silicon and the etched pit is an anisotropically wet etched pit.

6. The apparatus of claim 1 wherein the semiconductor substrate comprises single crystal silicon and the etched pit is a directionally dry etched pit.

7. The apparatus of claim 1 wherein the patterned metal layer includes a U-shaped patterned metal area, and wherein the etched pit is an anisotropically etched pit disposed inside the U-shaped patterned metal area.

8. The apparatus of claim 1 wherein the patterned metal layer includes a ring-shaped patterned metal area, and wherein the etched pit is an anisotropically etched pit disposed inside the ring-shaped patterned metal area.

9. The apparatus of claim 1 further comprising:
   e) a patterned metal pad disposed on the dielectric layer; and
   f) solder disposed on the patterned metal pad, wherein an optoelectronic device is soldered to the patterned metal pad.

10. The apparatus of claim 1 wherein the patterned metal pad is spaced away from the dielectric sidewall.

11. The apparatus of claim 1 wherein the patterned metal pad and the patterned metal layer comprise identical deposited materials.

12. An etched optoelectronic apparatus comprising:
    a) a semiconductor substrate having an etched pit with semiconductor sidewalls;
    b) a dielectric layer disposed on the semiconductor substrate, wherein the dielectric layer is planar with a uniform thickness and has a hole with dielectric sidewalls, wherein the dielectric sidewalls are aligned with the semiconductor sidewalls
    c) a patterned metal layer disposed directly on the dielectric layer, wherein the patterned metal layer has sidewalls aligned with the dielectric sidewalls and semiconductor sidewalls, and wherein the patterned metal layer includes a U-shaped patterned metal area, with the etched pit disposed inside the U-shaped patterned metal area; and
    d) an optical component in the etched pit.

13. The apparatus of claim 12 wherein the patterned metal layer has damaged portions and undamaged portions, and wherein the damaged portions are adjacent to the dielectric sidewalls and semiconductor sidewalls.

14. The apparatus of claim 12 wherein the damaged portions of the patterned metal layer are damaged by exposure to an etching process that formed the semiconductor etched pit.

15. An etched optoelectronic apparatus comprising:
    a) a semiconductor substrate having an etched pit with semiconductor sidewalls;
    b) a dielectric layer disposed on the semiconductor substrate, wherein the dielectric layer is planar with a uniform thickness and has a hole with dielectric sidewalls, wherein the dielectric sidewalls are aligned with the semiconductor sidewalls;
    c) a patterned metal layer disposed directly on the dielectric layer, wherein the patterned metal layer has sidewalls aligned with the dielectric sidewalls and semiconductor sidewalls;
    d) a patterned metal pad disposed on the dielectric layer;
    e) solder disposed on the patterned metal pad; and
    f) an optoelectronic device on the solder.

16. The apparatus of claim 15 wherein the patterned metal layer has damaged portions and undamaged portions, and wherein the damaged portions are adjacent to the dielectric sidewalls and semiconductor sidewalls.

17. The apparatus of claim 15 wherein the damaged portions of the patterned metal layer are damaged by exposure to an etching process that formed the semiconductor etched pit.

18. An etched optoelectronic apparatus comprising:
    a) a semiconductor substrate having an etched pit with semiconductor sidewalls;
    b) a dielectric layer over the semiconductor substrate, wherein the dielectric layer has a hole with dielectric sidewalls, and wherein the dielectric sidewalls are aligned with the semiconductor sidewalls;
    c) a patterned metal layer over the dielectric layer comprising: sidewalls aligned with the dielectric sidewalls and the semiconductor sidewalls; and a non-sacrificial metal pad structure comprising a first region for receiving an active optoelectronic device connected to a second region for electrical connection, wherein the first and second regions are coplanar, and wherein the patterned metal layer is formed from a single mask.

19. The apparatus of claim 18, further comprising an optoelectronic device in electrical contact with the first region of the metal pad structure.

20. A method for fabricating the etched optoelectronic apparatus of claim 1, comprising the steps of:
    a) providing a semiconductor substrate with a top surface and a dielectric layer on the top surface;
    b) forming a patterned metal layer on the dielectric layer, wherein the patterned metal layer has a metal edge;
    c) forming a patterned resist layer on the dielectric layer and patterned metal layer, wherein the resist layer has a resist edge that is located on top of the metal layer such that the dielectric layer has an exposed area defined by the metal edge;
    d) etching away the dielectric layer from the exposed area;

e) etching the semiconductor substrate where the dielectric layer is etched away in step (d), thereby forming a pit; and f) placing an optical component into the pit.

21. The method of claim 20 wherein the semiconductor substrate is made of a material selected from the group consisting of silicon, doped silicon, and GaAs.

22. The method of claim 20 wherein the dielectric layer is made of a material selected from the group consisting of silicon dioxide, silicon nitride, and silicon carbide.

23. The method of claim 20 wherein the patterned metal layer comprises a metal selected from the group consisting of chromium, nickel, titanium, platinum, aluminum, silver, copper and tantalum.

24. The method of claim 20 wherein step (d) comprises directional dry etching.

25. The method of claim 20 wherein step (d) comprises wet etching.

26. The method of claim 20 wherein step (e) comprises wet anisotropic etching.

27. The method of claim 20 wherein step (e) comprises directional dry etching.

28. The method of claim 20 wherein the patterned metal layer comprises a metal selected from the group consisting of chromium and gold.

29. The method of claim 20 wherein the patterned metal layer comprises a metal ring, and wherein the patterned resist layer does not cover an interior of the ring.

30. The method of claim 20 further comprising the step of removing the patterned resist layer, and then repeating steps (c), (d) and (e).

31. The method of claim 20 wherein the patterned metal layer comprises a metal U-shape.

* * * * *